(12) United States Patent
Kutsukake et al.

(10) Patent No.: US 7,615,485 B2
(45) Date of Patent: Nov. 10, 2009

(54) METHOD OF MANUFACTURE OF CONTACT PLUG AND INTERCONNECTION LAYER OF SEMICONDUCTOR DEVICE

(75) Inventors: Hiroyuki Kutsukake, Yokohama (JP);
Yasuhiko Matsunaga, Yokohama (JP);
Shoichi Miyazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 11/877,833

(22) Filed: Oct. 24, 2007

(65) Prior Publication Data
US 2008/0050908 A1 Feb. 28, 2008

Related U.S. Application Data

(62) Division of application No. 11/219,724, filed on Sep. 7, 2005, now Pat. No. 7,375,430.

(30) Foreign Application Priority Data
Apr. 27, 2005 (JP) ............... 2005-129540

(51) Int. Cl.
*H01L 23/535* (2006.01)
(52) U.S. Cl. ................. 438/637; 438/639; 257/E21.577
(58) Field of Classification Search .............. 438/637, 438/639; 257/E21.577
See application file for complete search history.

(56) References Cited

U.S. PATENT DOCUMENTS
2001/0019142 A1 9/2001 Nakahata et al.
2002/0098686 A1 7/2002 Kobayashi et al.
2005/0139904 A1 6/2005 Kamigaichi et al.
2005/0181542 A1 8/2005 Enquist
2007/0037379 A1 2/2007 Enquist et al.
2007/0057316 A1 3/2007 Yaegashi FOREIGN PATENT DOCUMENTS
| JP | 9-115903 | 5/1997 |
|----|----------|--------|
| JP | 9-162389 | 6/1997 |
| JP | 2000-21985 | 1/2000 |
| JP | 2002-280463 | 9/2002 |
| JP | 2003-243619 | 8/2003 |
| JP | 2004-6433 | 1/2004 |
| JP | 2004-14783 | 1/2004 |
| JP | 2004-356521 | 12/2004 |

*Primary Examiner*—George Fourson
(74) *Attorney, Agent, or Firm*—Oblon, Spivak, McClelland, Maier & Neustadt, L.L.P.

(57) ABSTRACT

A method of manufacturing a semiconductor device including forming two first gate electrodes along a first direction on a first surface of a semiconductor substrate and source/drain areas sandwiching a channel region under each of the first gate electrodes, forming a first interlayer insulating layer to fill a region between the first gate electrodes, lowering a top of the first interlayer insulating layer, depositing a second interlayer insulating layer on the first interlayer insulating layer and the first gate electrodes, planarizing a surface of the second interlayer insulating layer, and forming an interconnect layer in the second interlayer insulating layer and a contact plug in the first interlayer insulating layer and the second interlayer insulating layer so that the contact plug is in contact with the interconnect layer and one of the source/drain areas.

8 Claims, 21 Drawing Sheets

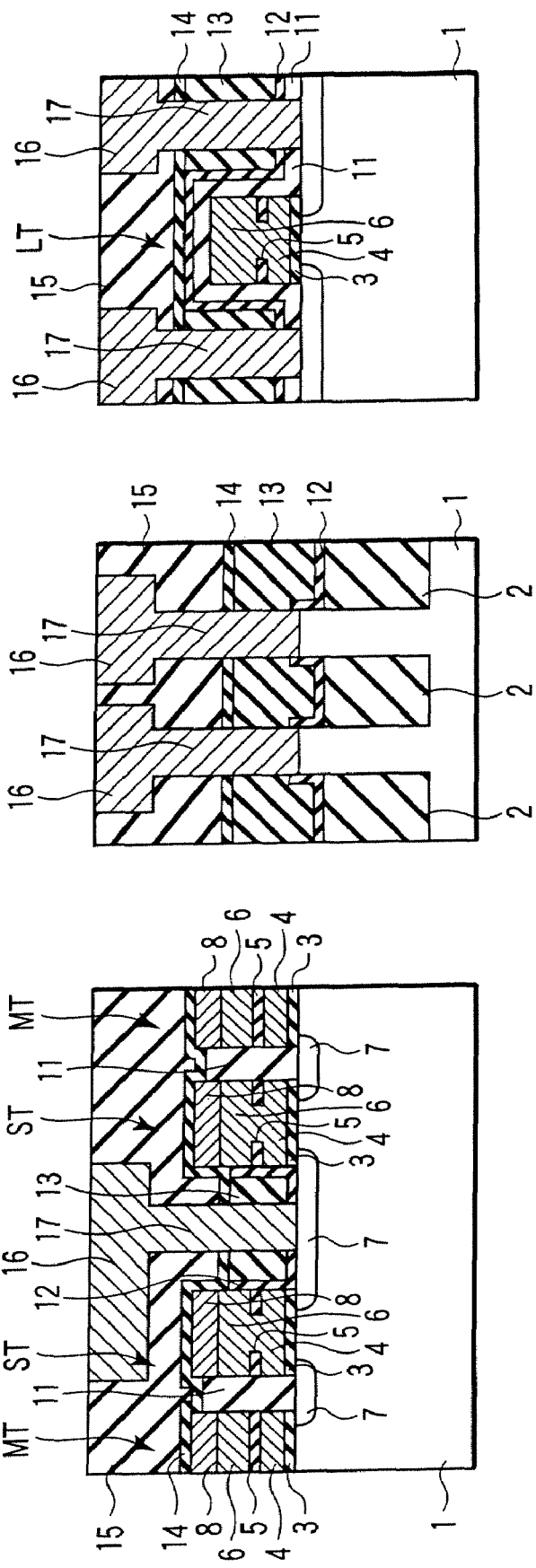

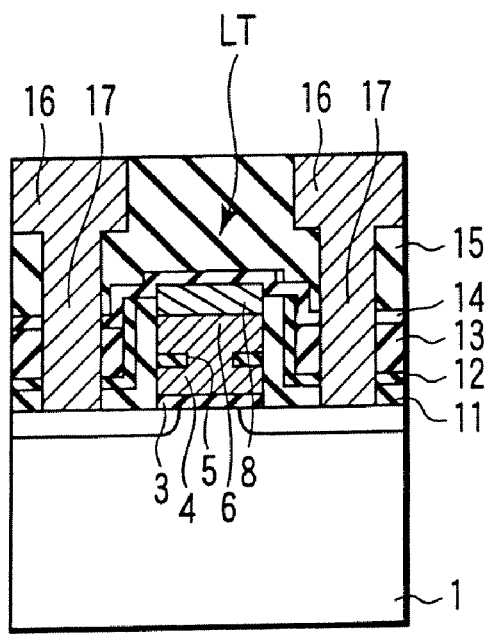
F I G. 15
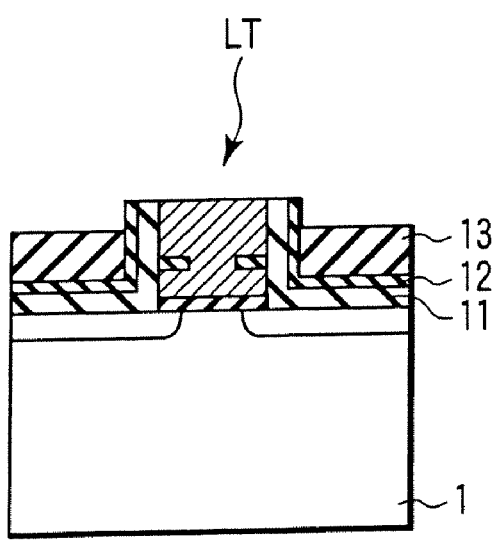
F I G. 16

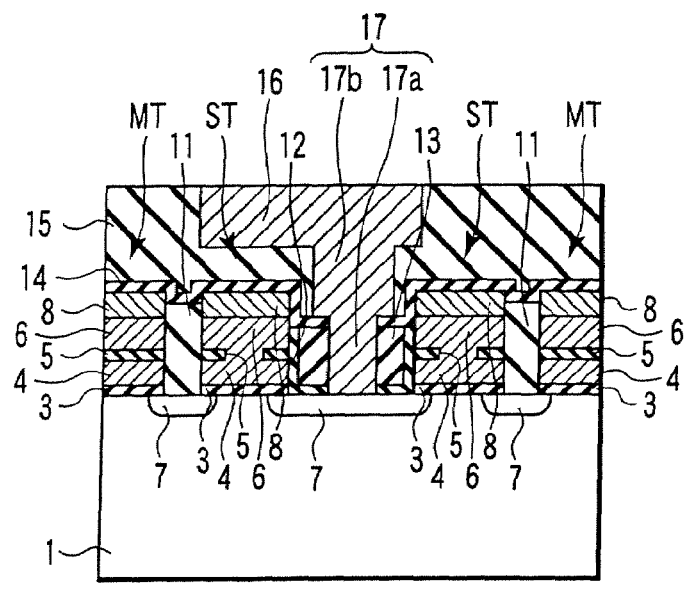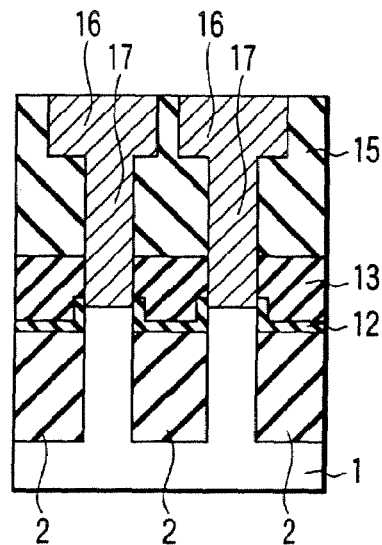
FIG. 19A    FIG. 19B
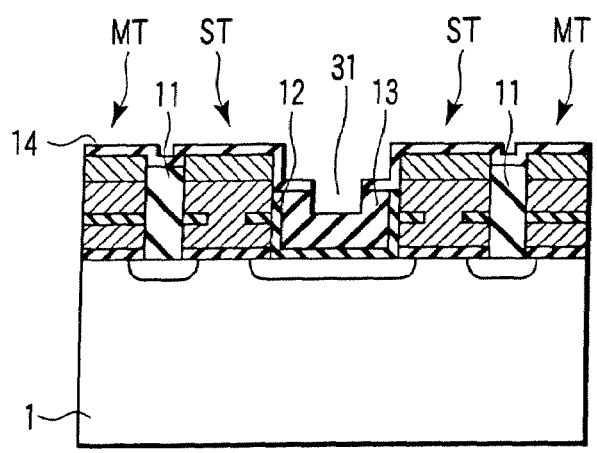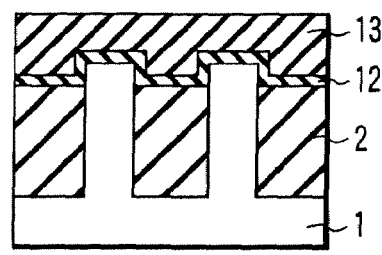
FIG. 20A    FIG. 20B

METHOD OF MANUFACTURE OF CONTACT PLUG AND INTERCONNECTION LAYER OF SEMICONDUCTOR DEVICE

CROSS-REFERENCE TO RELATED APPLICATIONS

This application is a divisional of U.S. application Ser. No. 11/219,724, filed Sep. 7, 2005, now U.S. Pat. No. 7,375,430, and is based upon and claims the benefit of priority from prior Japanese Patent Application No. 2005-129540, filed Apr. 27, 2005, the entire contents of which are incorporated herein by reference.

BACKGROUND OF THE INVENTION

1. Field of the Invention

The present invention relates to a semiconductor device and more particularly to a method of manufacturing contacts and metal interconnections in the cell and peripheral circuit areas of a nonvolatile semiconductor memory device.

2. Description of the Related Art

A NAND-type flash memory is known as one of the nonvolatile semiconductor devices. The cell array of the NAND-type flash memory has cell transistors and select gate transistors. In many cases, a peripheral circuit required for the operation of the memory is formed on a single substrate together with a memory cell array.

The gate electrodes of the cell transistors and select gate transistors may be subjected to silicidation. The silicidation of the gate electrodes can lower the resistance between them and contact plugs. On the other hand, the gate electrode structures of transistors in the peripheral circuit area are not subjected to silicidation when they are used as high-resistance elements. This causes the following phenomena to occur depending on the manufacturing process.

The gate structure which is not subjected to silicidation is coated with a barrier layer. After the barrier layer has been formed to coat the gate electrodes and the gate structures in the memory cell area and the peripheral circuit area, portions of the barrier layer which overlie the gate electrodes that are subjected to silicidation are removed. In removing the barrier layer, the interlayer insulating layer underlying the barrier layer is also etched partially because high selectivity cannot be adopted between the interlayer insulating layer and the barrier layer. As a result, the top of the interlayer insulating layer between the gate electrodes becomes much lower in level than the top of the gate structures.

After the silicidation process, a further interlayer insulating layer is deposited over the entire surface of the semiconductor substrate. At this point, depressions are formed in the upper-level interlayer insulating layer along the portions in the top of the lower-level interlayer insulating layer which have sunk. After that, interconnect trenches for bit lines are formed so as to cross the depressions and the depressions and the interconnect trenches are filled with conductive material. As a result, interconnect layers 103 are formed as shown in FIG. 27. At this point, a conductive material 102 buried in the previously formed depressions would electrically connect the interconnect layers 103 with one another.

The influence of steps in the underlying interlayer insulating layer 101 on the thickness of the interconnect layers 103 may cause variations in interconnect resistance. In FIG. 27, reference numeral 104 denotes a contact plug.

In order to prevent the interlayer insulating layer from being etched, one might suggest a high selectivity between the barrier layer and the underlying interlayer insulating layer. However, no combination of materials which meet the required functions of the interlayer insulating layer and the barrier layer and yet allow high selectivity therebetween has been realized up to date.

BRIEF SUMMARY OF THE INVENTION

According to a first aspect of the present invention, there is provided a semiconductor device comprising: a semiconductor substrate having a first surface; two first gate electrodes formed along a first direction on the first surface; source/drain areas formed in the first surface and sandwiching a channel region under each of the first gate electrodes; a first interlayer insulating layer filling a region between the first gate electrodes and having a top lower in level than a top of each of the first gate electrodes; a second interlayer insulating layer formed above the first gate electrodes and the first interlayer insulating layer; two interconnect layers formed in the second interlayer insulating layer along a direction which intersects the first direction and being electrically insulated from each other, a region between the interconnect layers being filled with the second interlayer insulating layer; and a contact plug formed in the first interlayer insulating layer and the second interlayer insulating layer and being in contact with one of the interconnect layers and one of the source/drain areas.

According to a second aspect of the present invention, there is provided a method of manufacturing a semiconductor device comprising: forming two first gate electrodes along a first direction on a first surface of a semiconductor substrate and source/drain areas sandwiching a channel region under each of the first gate electrodes; forming a first interlayer insulating layer to fill a region between the first gate electrodes; lowering a top of the first interlayer insulating layer; depositing a second interlayer insulating layer on the first interlayer insulating layer and the first gate electrodes; planarizing a surface of the second interlayer insulating layer; and forming an interconnect layer in the second interlayer insulating layer and a contact plug in the first interlayer insulating layer and the second interlayer insulating layer so that the contact plug is in contact with the interconnect layer and one of the source/drain areas.

BRIEF DESCRIPTION OF THE SEVERAL VIEWS OF THE DRAWING

FIGS. 2A, 2B and 2C are sectional views of the semiconductor device shown in FIGS. 1A and 1B;

FIG. 15 is a sectional view of a semiconductor device according to a modification of the first embodiment;

FIGS. 16, 17 and 18 are sectional views in the order of manufacture of the semiconductor device of FIG. 15;

FIGS. 19A and 19B are sectional views of a semiconductor device according to a second embodiment of the present invention;

FIGS. 20A, 21A, 22A, 23A, 24A and 25A are sectional views in the order of manufacture of the sectional structure of FIG. 19A;

FIGS. 20B, 21B, 22B, 23B, 24B and 25B are sectional views in the order of manufacture of the sectional structure of FIG. 19B;

DETAILED DESCRIPTION OF THE INVENTION

Figures 1A, 1B:
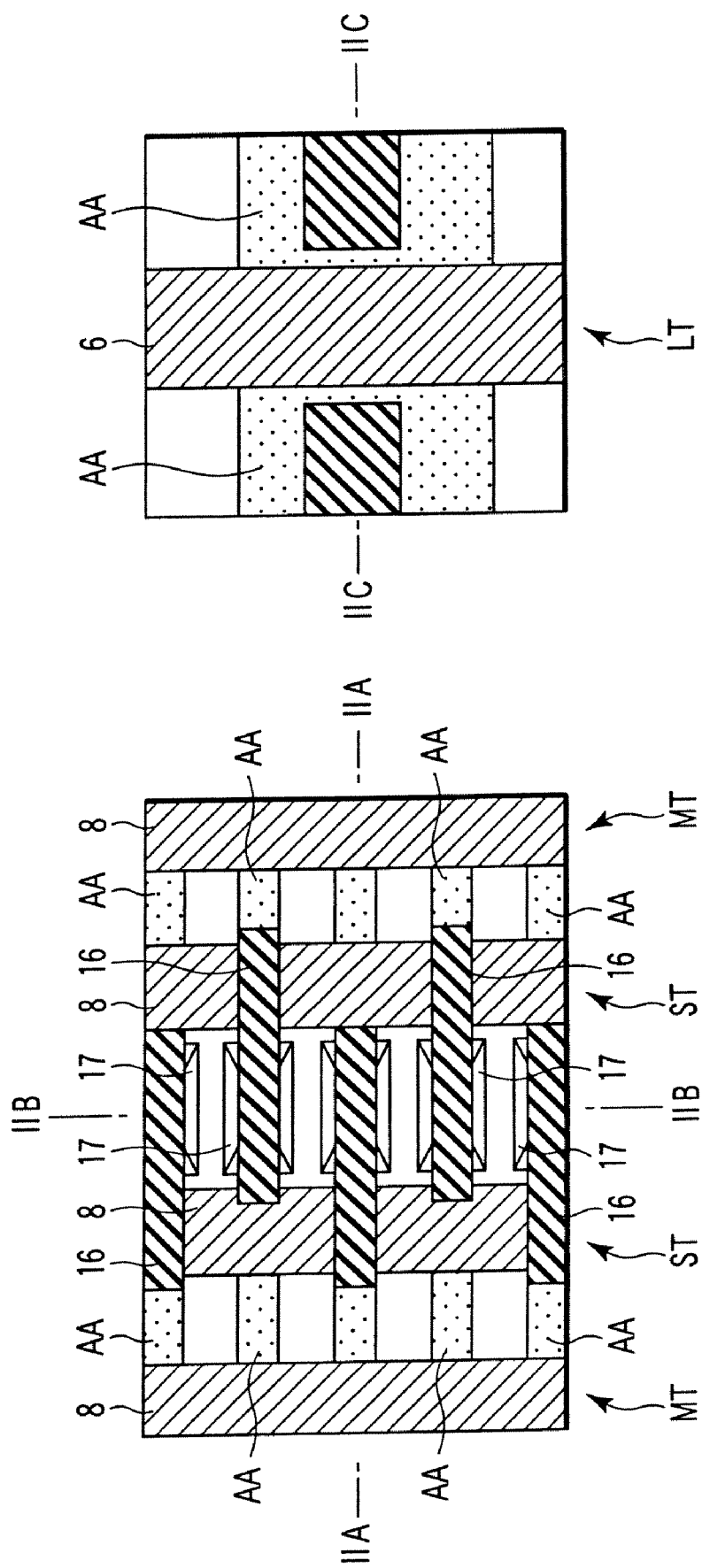
FIGS. 1A and 1B are plan views of a semiconductor device according to a first embodiment of the present invention.

The embodiments of the present invention will be described hereinafter with reference to the accompanying drawings. In the description which follows, the same or functionally equivalent elements are denoted by like reference numerals and repeated descriptions are given only when necessary.

First Embodiment

A semiconductor device according to a first embodiment of the present invention will be described with reference to FIGS. 1A and 1B through FIGS. 14A, 14B and 14C. FIGS. 1A and 1B are schematic plan views of the main portion of the semiconductor device of the first embodiment of the present invention. FIG. 1A shows the memory cell area and FIG. 1B shows the peripheral circuit area. FIGS. 2A and 2B are sectional views of the semiconductor device taken along lines IIA-IIA, IIB-IIB, respectively, of FIG. 1A and FIG. 2C is a sectional view taken along line IIC-IIC of FIG. 1B.

The first embodiment and a second embodiment to be described later are each described in terms of a semiconductor storage device having a NAND structure.

As shown in FIGS. 1A, 1B, 2A, 2B and 2C, a semiconductor substrate 1 which is made of, for example, silicon is formed on top (first surface) with a device isolation insulating layer 2, which has an shallow trench isolation (STI) structure and defines active areas AA.

Memory cell transistors and select gate transistors are formed on the semiconductor substrate 1 in the active areas of the memory cell area. High-resistivity resistance devices forming logic circuits are formed on the semiconductor substrate 1 in the peripheral circuit area.

The memory cell transistor has a gate structure (a gate transistor and a gate electrode) MT and source/drain areas 7. The select gate transistor has a gate structure ST and source/drain areas 7. The high-resistivity resistance device is composed of a gate structure LT. The gate structures MT and ST extend in a first direction on the surface of the semiconductor substrate 1. The first direction corresponds to a direction perpendicular to the paper of FIG. 2A and the right-and-left direction of FIG. 2B.

The gate structures MT, ST and LT are each composed of a gate insulating layer 3, a floating gate electrode 4, an intergate insulating layer 5, and a control gate electrode 6, which are sequentially formed on the semiconductor substrate 1. The floating gate electrode 4 and the control gate electrode 6 are formed from, for example, conductive polysilicon.

The intergate insulating layer 5 of each of the gate structures ST and LT has an opening so that the floating gate electrode 4 and the control gate electrode 6 are electrically connected to each other. This allows the select gate transistor to operate as a usual transistor. By setting the size of the gate structure LT as viewed from above (planar size) to an appropriate one, this portion is allowed to function as a resistive element. By forming the source/drain areas 7 on opposite sides of the gate structure LT, it is also allowed to function as a logic transistor forming a part of the logic circuits. In the drawings, the source/drain areas 7 in the peripheral circuit area are also illustrated.

The source/drain areas 7 are shared by adjacent two of the memory cells and select gate transistors. The control gate electrodes of the gate structures MT and ST are formed on top with silicide layers 8 made of CoSi or the like by being subjected to silicidation. The gate structure LT is not subjected to silicidation in order to implement a high-resistivity resistance device.

The area between the gate structures MT and ST is filled with an interlayer insulating layer 11, which is made of, for example, tetraethoxysilane (TEOS), SiN, or a composite thereof. The interlayer insulating layer 11 covers the surface of the gate structure LT and the semiconductor substrate 1 in the peripheral circuit area. The top of the interlayer insulating layer 11 between the gate structures MT and ST is slightly lower in level than the top of the silicide 8.

A barrier layer 12, made of, for example, SiN, is formed to overlie the interlayer insulating layer 11. The barrier layer 12 also overlies the semiconductor substrate 1 and the device isolation insulating layer 2 between the gate structures ST. The barrier layer 12 keeps the silicidation for the gate structures MT and ST from reaching the gate structure LT.

A pre-metal dielectric (PMD) layer (interlayer insulating layer) 13 fills the gap between the gate structures ST. The interlayer insulating layer 13 is made of a material which can fill the gap without making many voids. The material for the interlayer insulating layer 13 may be borophosphosilicate (BPSG), borosilicate glass (BSG) or polysilazane (PSZ). In the peripheral circuit area, the interlayer insulating layer 13 is deposited onto the barrier layer 12 on the semiconductor substrate 1 up to the same level as the barrier layer 12 on the gate structure LT. The top of the intergate insulating layer 13 between the gate structures ST is lower than the top of the interlayer insulating layer 11. This occurs in a process to be described later because of a difference in etch rate between those materials.

The PMD film 13 between the gate structures ST is coated with a barrier layer 14 made of, for example, SiN. In the peripheral circuit area, the barrier layer 12 and the PMD film 13 are coated with the barrier layer 14.

A PMD film (interlayer insulating layer) 15 is formed on the barrier layers 12 and 14. The PMD film 15 is formed from, for example, TEOS. Interconnect layers 16 are formed in the surface of the PMD film 15. The interconnect layers 16 each extend in a direction crossing the first direction and are arranged at a predetermined distance apart from one another in the first direction.

The interconnect layers 16 are connected to the active areas AA (source/drain areas 7) through contact plugs 17. The contact plugs 17 penetrate the PMD films 13 and 15 and the barrier layers 12 and 14 to reach the surface of the semiconductor substrate 1.

Figure 26:
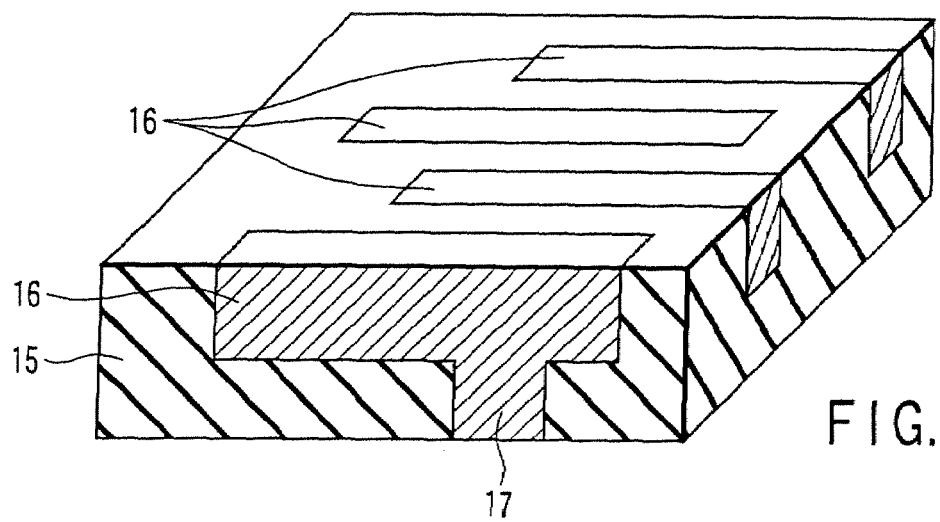
FIG. 26 is a schematic perspective view of a portion of a semiconductor storage device according to the first embodiment.
Figure 27:
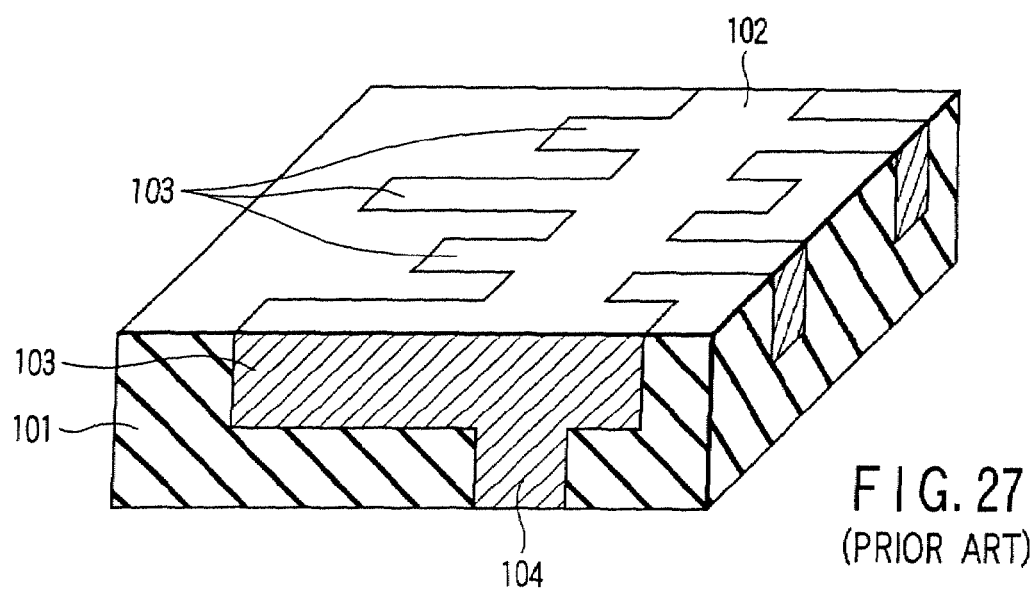
FIG. 27 is a schematic perspective view of a conventional semiconductor device at a step of manufacture.

FIG. 26 is a schematic perspective view of the upper portion of FIG. 2A including the PMD film 15. As shown, no other trenches and conductive materials than the interconnect layers 16 exist in the surface of the PMD film 15. That is, no portion corresponding to the depression 102 shown in FIG. 27 is formed and the space between each interconnect layer 16 is filled with the PMD film 15. Thus, the interconnect layers (bit lines) 16 are prevented from being connected with one another.

Next, a method of manufacturing the semiconductor device shown in FIGS. 1A, 1B, 2A, 2B and 2C will be described with reference to FIGS. 3A, 3B and 3C through FIGS. 14A, 14B and 14C. FIGS. 3A through 14A are sectional views, in the order of steps of manufacture, of the structure of FIG. 2A. FIGS. 3B through 14B are sectional views, in the order of steps of manufacture, of the structure of FIG. 2B. FIGS. 3C through 14C are sectional views, in the order of steps of manufacture, of the structure of FIG. 2C.

Figure 3C:
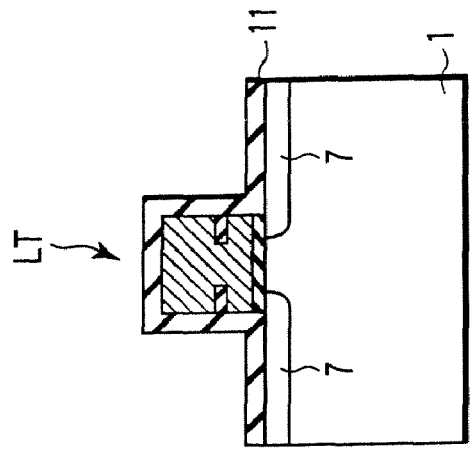
FIGS. 3C, 4C, 5C, 6C, 7C, 8C, 9C, 10C, 11C, 12C, 13C and 14C are sectional views in the order of manufacture of the sectional structure of FIG. 2C.
Figure 3B:
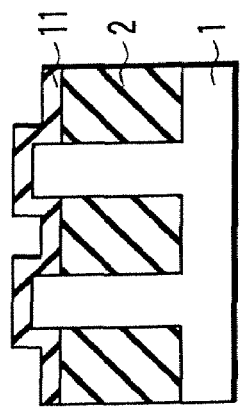
FIGS. 3B, 4B, 5B, 6B, 7B, 8B, 9B, 10B, 11B, 12B, 13B and 14B are sectional views in the order of manufacture of the sectional structure of FIG. 2B.
Figure 3A:
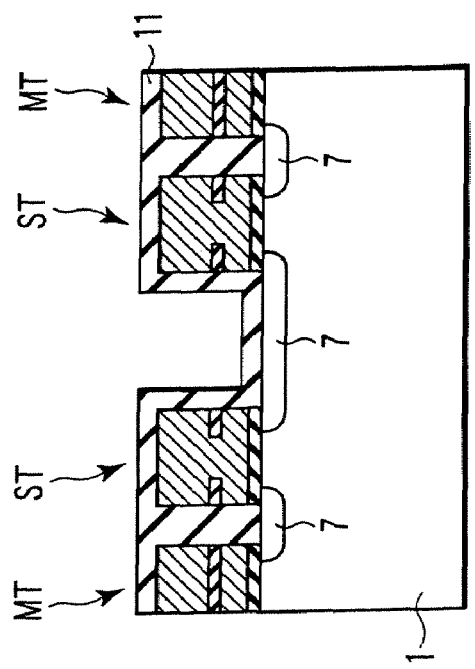
FIGS. 3A, 4A, 5A, 6A, 7A, 8A, 9A, 10A, 11A, 12A, 13A and 14A are sectional views in the order of manufacture of the sectional structure of FIG. 2A.

As shown in FIGS. 3A, 3B and 3C, the device isolation insulating layer 2, memory cell transistors, select gate transistors and logic transistors are formed. The manufacturing process up to the formation of the memory cell transistors, select gate transistors, and logic transistors can take various forms. A typical process will be described hereinafter.

First, an insulating layer forming the gate insulating layer 3 and a conductive layer forming the floating gate electrode 4 are sequentially formed on the surface of the semiconductor substrate 1 using the thermal oxidation method and the chemical vapor deposition (CVD) method. Next, trenches are formed in the insulating layer, the conductive layer and the semiconductor substrate 1 by means of lithographic and anisotropic etching (RIE) techniques. An insulating layer is then deposited to fill the trenches. The top of the insulating layer is etched back to the level slightly lower than the surface of the semiconductor substrate 1, thereby forming the device isolation insulating layer 2.

Next, an insulating layer forming the intergate insulating layer 5 and a conductive layer forming the control gate electrode 6 are sequentially formed on the conductive layer forming the floating gate electrode 4. The insulating layers and the conductive layers thus far deposited are patterned by means of lithographic and etching techniques. As a result, the gate structures MT, ST and LT are formed.

Thus, the gate structures MT, ST and LT are formed by the same process and hence have the same height.

Next, the source/drain areas 7 are formed by means of ion implantation techniques.

Next, the interlayer insulating layer 11 is deposited over the entire surface of the structure thus far obtained. As a result, the surface of the semiconductor substrate 1 between the gate structures ST and in the peripheral circuit area, and the surface of each of the gate structures MT, ST and LT are covered with the interlayer insulating layer 11. The area between the gate structures ST and MT is filled with the interlayer insulating layer 11.

Figure 4C:
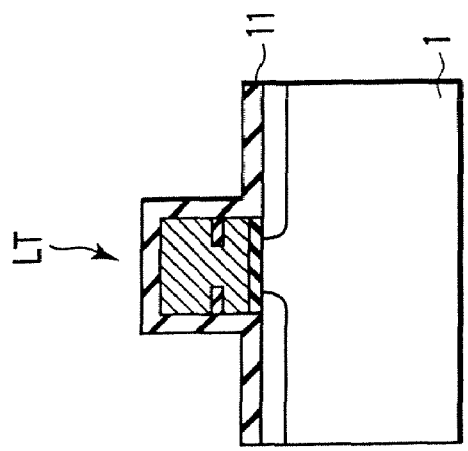
Figure 4B:
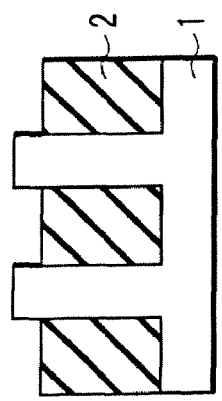
Figure 4A:
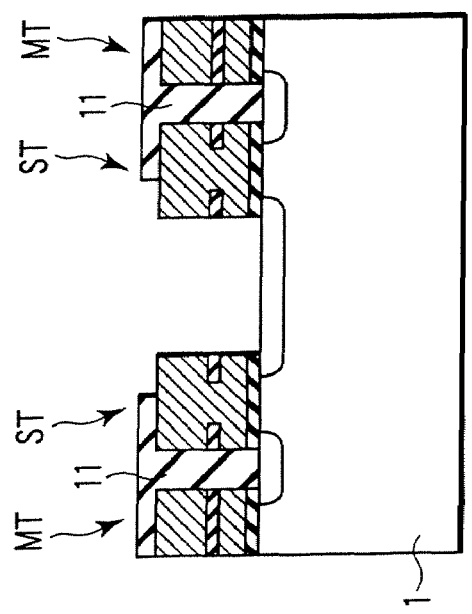

Next, a masking layer (not shown) having an opening in the area between the gate structures ST is formed on the interlayer insulating layer 11. This opening extends in a direction perpendicular to the paper of FIG. 4A or in the vertical direction of FIG. 1A. Next, as shown in FIGS. 4A, 4B and 4C, the interlayer insulating layer 11 between the gate structures ST is etched away using the masking layer as a mask. At this point, a portion of the top of each gate structure ST is exposed.

Figure 5A:
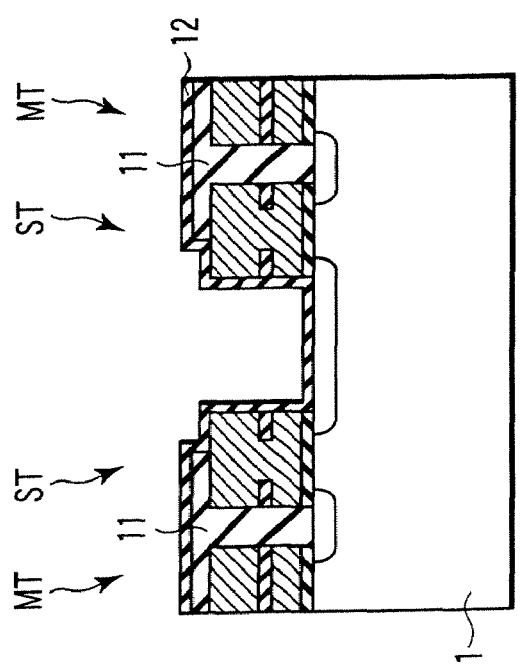
Figure 5B:
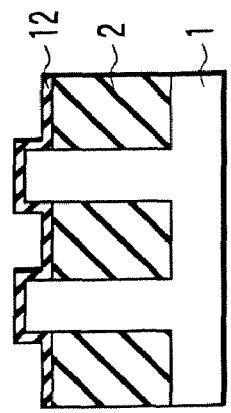
Figure 5C:
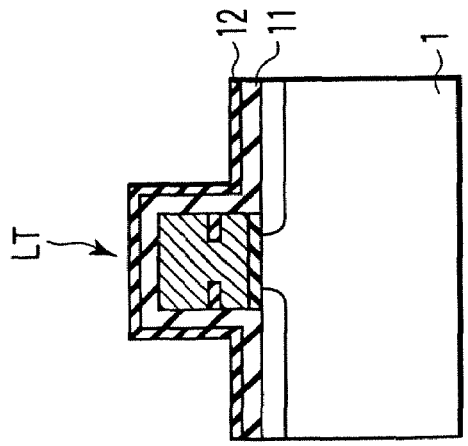

Next, as shown in FIGS. 5A, 5B and 5C, a barrier layer 12 is deposited over the entire surface of the structure thus far formed. As a result, the portion of the semiconductor substrate 1 between the gate structures ST, the device isolation insulating layer 2 and the portion of the top and the sidewall of the gate structure ST are covered with the barrier layer 12. The gate structure LT is also enclosed by the barrier layer 12 both on the top and on the side.

Figure 6C:
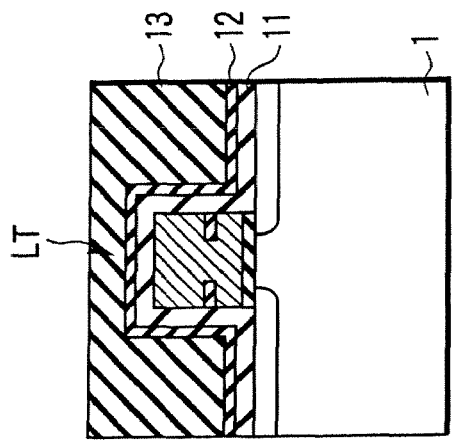
Figure 6B:
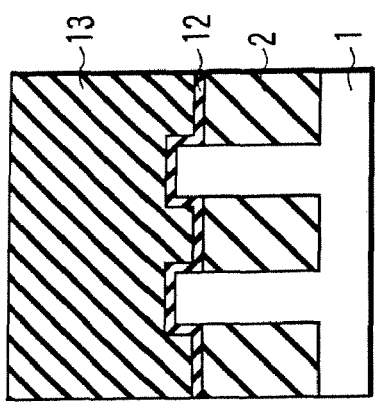
Figure 6A:
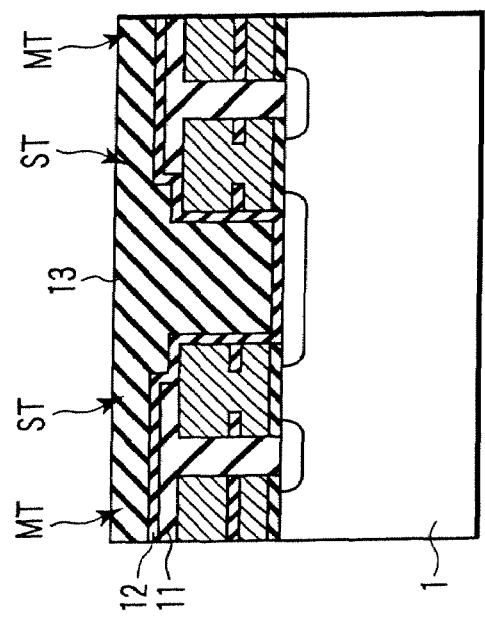

Next, as shown in FIGS. 6A, 6B and 6C, a PMD film 13 is deposited over the entire surface of the barrier layer 12. At this point, the area between the gate structures ST is filled with the PMD film 13.

Figure 7A:
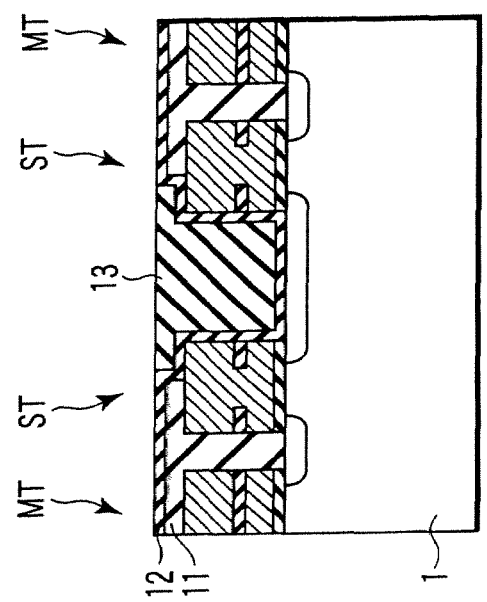
Figure 7B:
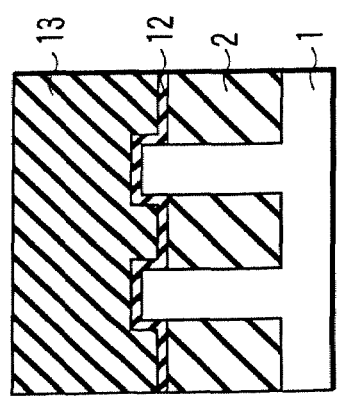
Figure 7C:
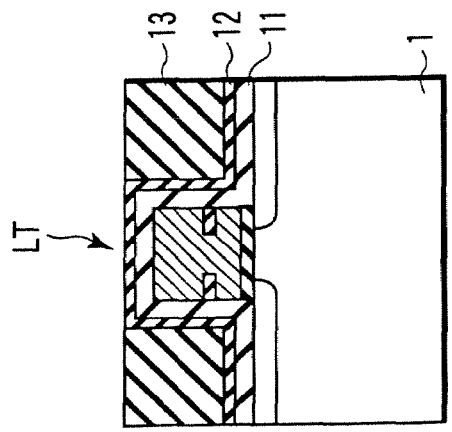

Next, as shown in FIGS. 7A, 7B and 7C, the PMD film 13 is planarized by means of chemical mechanical polishing (CMP) with the barrier layer 12 as a stopper.

Figure 8C:
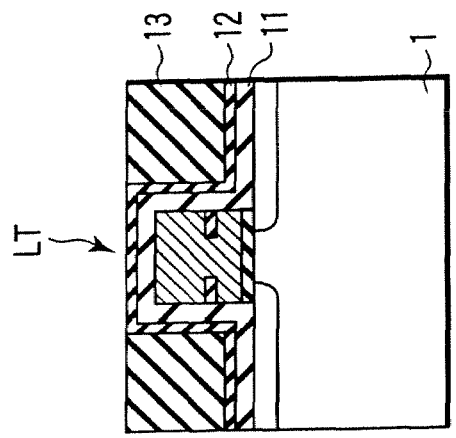
Figure 8B:
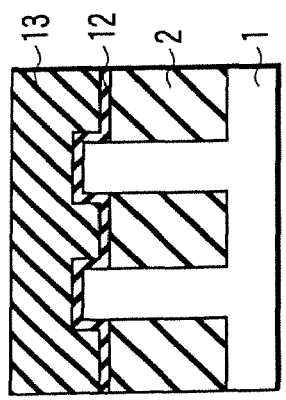
Figure 8A:
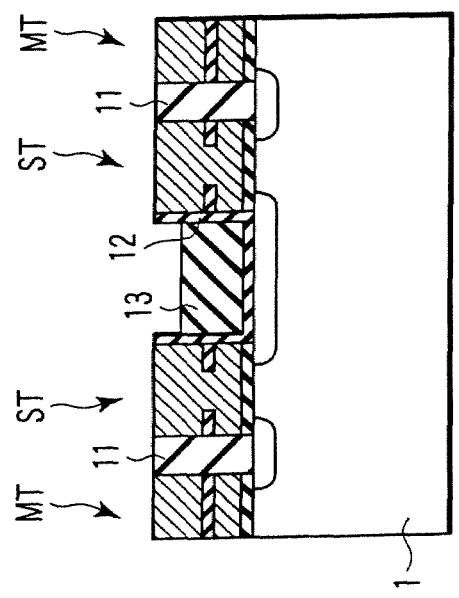

Next, a masking layer (not shown) is formed over the entire surface of the peripheral circuit area in the structure thus far obtained. Next, as shown in FIGS. 8A, 8B and 8C, the barrier layer 12 on the gate structures MT and ST is removed by means of, for example, RIE or wet etching using the masking layer as a mask. With the wet etching, it is desirable to provide the highest possible selectivity to the PMD film 13. However, in many cases, either etching technique cannot provide a sufficiently high selectivity between the barrier layer 12 and the PMD film 13 from the relationship between materials selected so as to ensure the function of each layer. For this reason, as shown in FIGS. 8A and 8B, the top of the PMD film 13 is partially etched. As a result, a difference in level is produced between the top of the PMD film 13 and the top of the gate structures MT and ST.

Figure 9C:
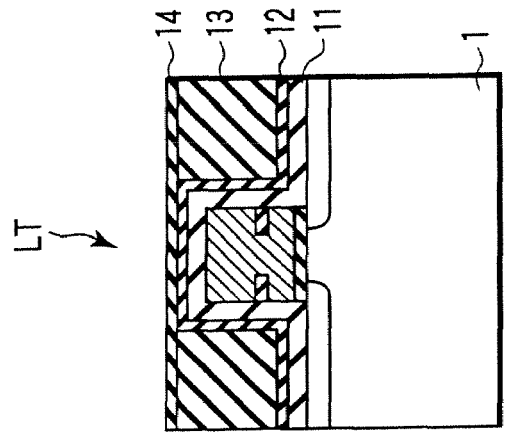
Figure 9B:
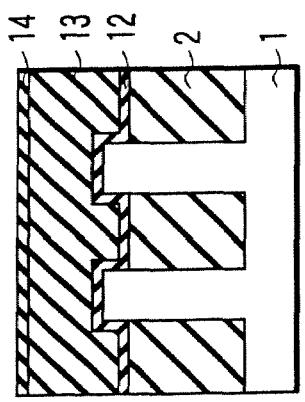
Figure 9A:
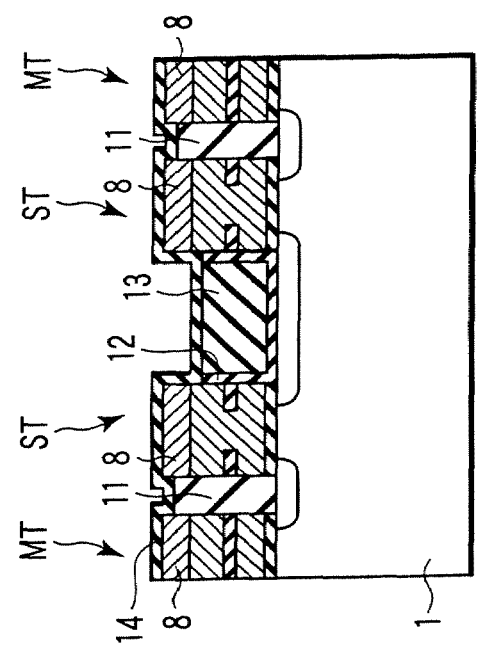

Next, as shown in FIGS. 9A, 9B and 9C, a material for silicide, for example, cobalt, is deposited on the gate structures MT and ST and then heat treatment is carried out to form a silicide layer 8. At this point, the top of each of the gate structures MT and ST rises due to the silicidation reaction. For this reason, a difference in level is produced between the top of the gate structures MT and ST and the top of the interlayer insulating layer 11 between the gate structures MT and ST. Next, a barrier layer 14 is deposited on the silicide layer 8, the interlayer insulating layer 11, the barrier layer 12, and the PMD film 13.

Figure 10C:
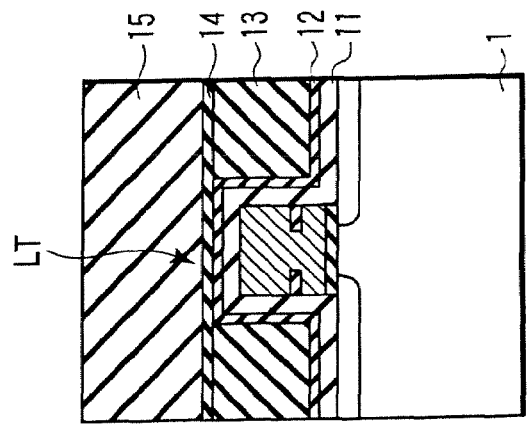
Figure 10B:
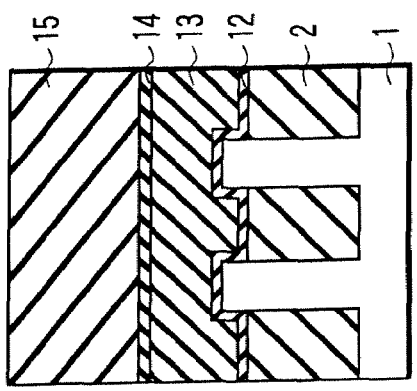
Figure 10A:
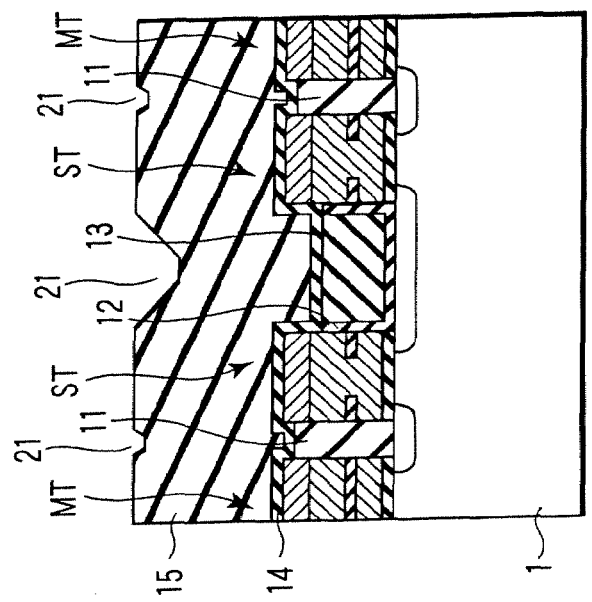

Next, as shown in FIGS. 10A, 10B and 10C, a PMD film 15 is deposited over the entire surface of the structure thus far obtained. At this point, because of the presence of gaps between the gate structures MT and ST and between the gate structures ST, depressions 21 are formed in the surface of the PMD film 15 above the gaps. The thickness of the PMD film 15 at this point is set so that the bottom of the depressions 21 is above the top of the PMD film 15 of the finished product shown in FIG. 2. The depressions 21 extend in a direction perpendicular to the paper of FIG. 10A or in the vertical direction of FIG. 1A.

The thicker a layer formed by CVD, the less the underlying layer affects to the shape of the CVD-formed layer. Thus, one might suggest making very large the thickness of the PMD film 15 formed by the step shown in FIGS. 10, 10B and 10C to eliminate the depression 21. However, making the thickness of the PMD film 15 too large leads difficulties in forming a contact hole for the contact plug 17.

In particular, the formation of contact holes in the peripheral circuit area becomes very difficult. That is, the stacked gate structure having a floating gate electrode and a control gate electrode as in this embodiment is higher than the gate structure of usual transistors. For this reason, when a PMD film is formed to the same height in the memory cell area and the peripheral circuit area, the PMD film on the usual gate structure becomes larger in thickness than that on the stacked gate structure. Thus, the formation of contact holes becomes more difficult in the usual gate structure portions. For this reason, making the thickness of the PMD film 15 very large is not practical because it may have irrecoverable effects on other steps.

For reference, the ratio in thickness of the gate structure to the overlying interlayer insulating layer is, for example, 1:2-3 for usual gate structure and 1:1-1.5 for stacked gate structure.

As will be described later, the present embodiment prevents the formation of the depression 21 without making the thickness of the PMD film 15 large. For this reason, the thickness of the PMD film 15 in this embodiment is smaller than that when it is made large in thickness to eliminate the depression 21.

Figure 11C:
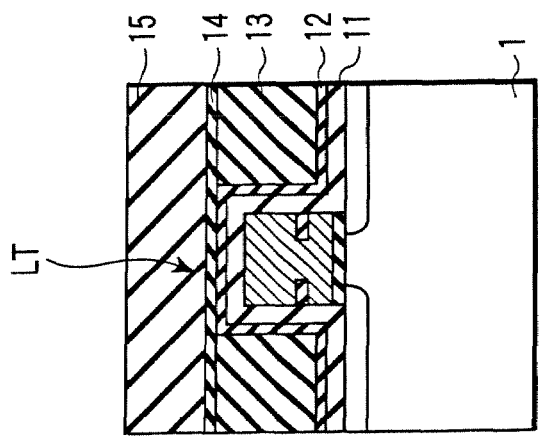
Figure 11B:
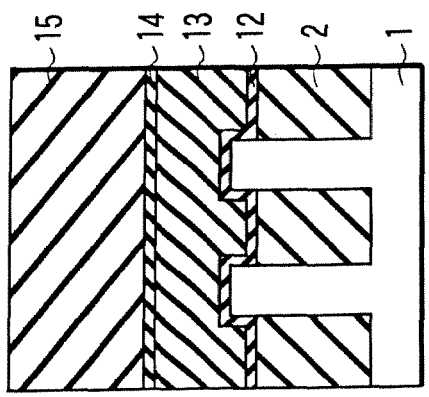
Figure 11A:
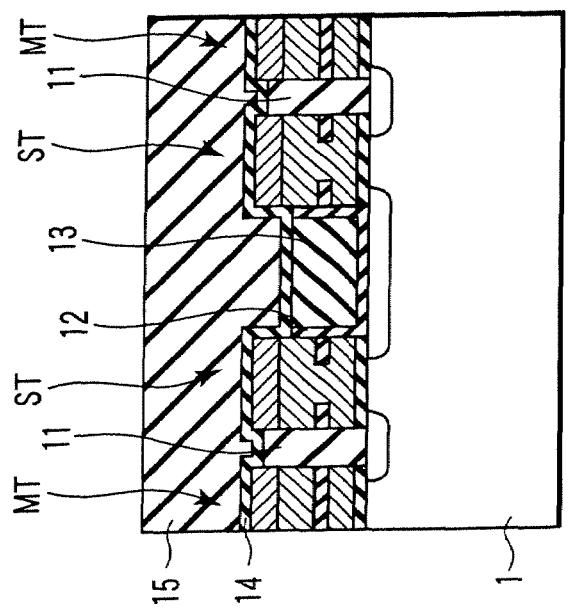

Next, as shown in FIGS. 11A, 11B and 11C, the top of the PMD film 15 is planarized by, for example, CMP until the previously formed depression 21 is eliminated.

Figure 12C:
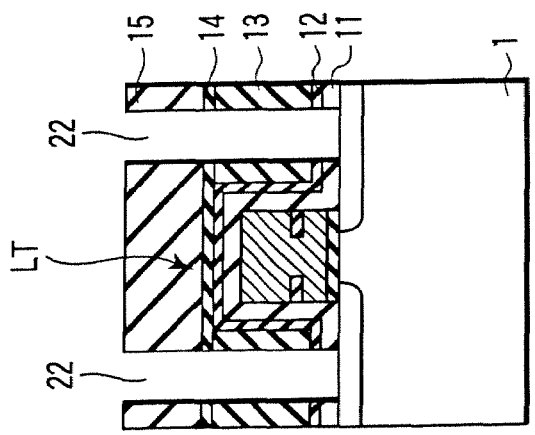
Figure 12B:
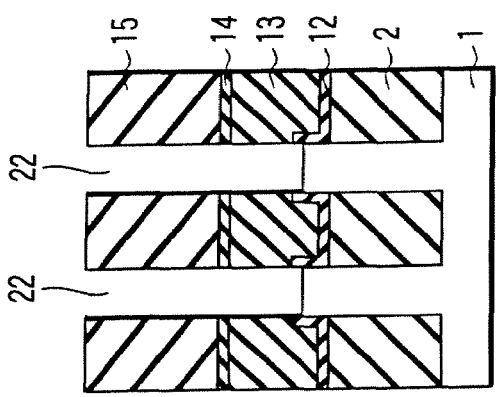
Figure 12A:
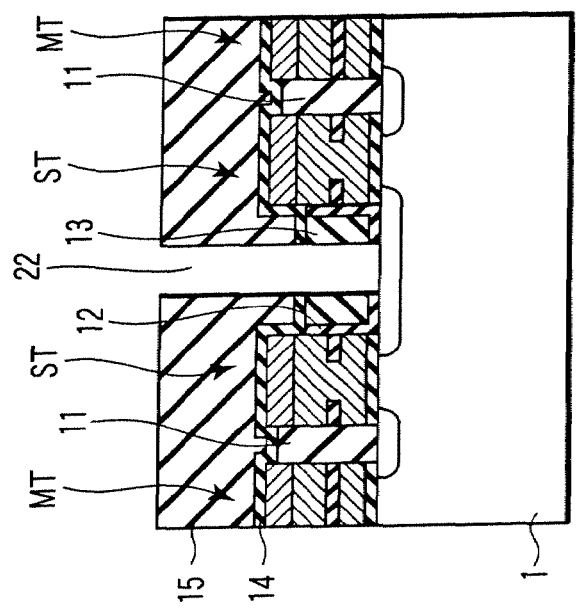

Next, as shown in FIGS. 12A, 12B and 12C, using conventional lithographic and etching techniques, contact holes 22 are formed in the areas where the contact plugs 17 are to be formed in the PMD film 15. The contact holes are formed to reach the semiconductor substrate 1.

Figure 13C:
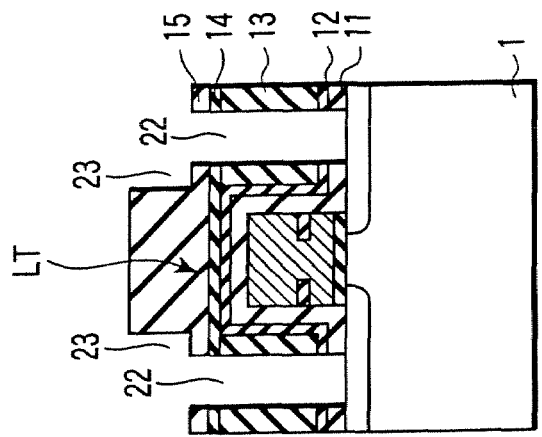
Figure 13B:
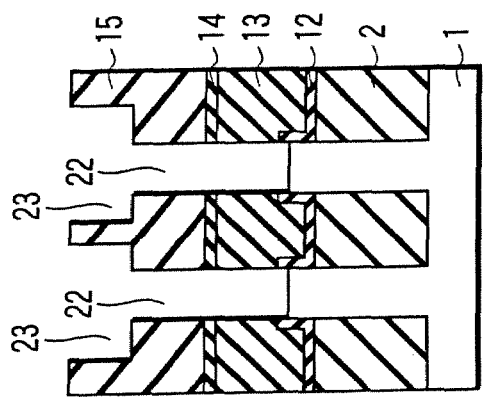
Figure 13A:
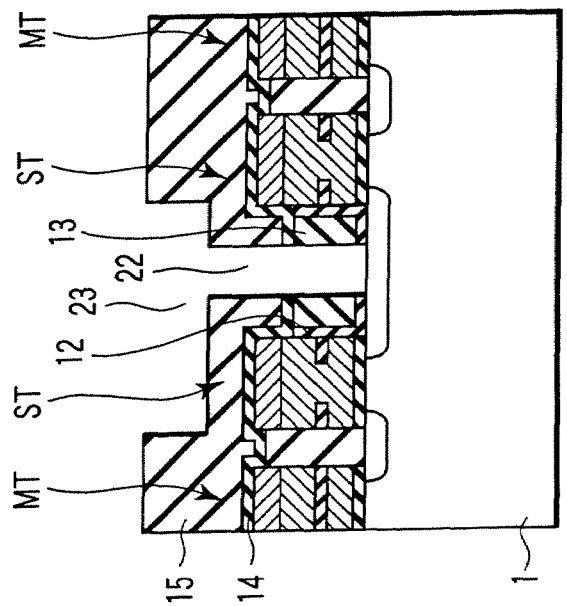

Next, as shown in FIGS. 13A, 13B and 13C, using conventional lithographic and etching techniques, interconnect trenches 23 are formed in a predetermined pattern. The interconnect trenches 23 has a dual damascene structure connected to the contact plugs 22.

Figure 14C:
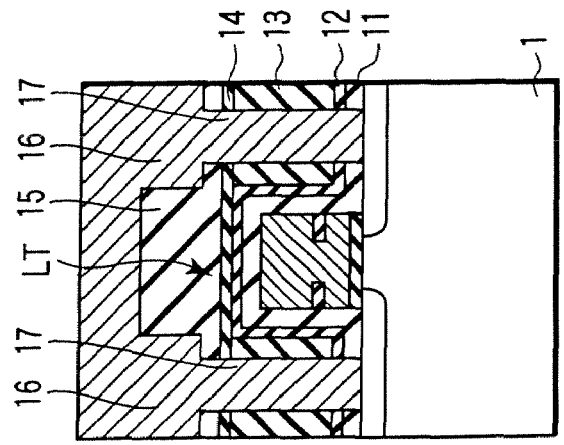
Figure 14B:
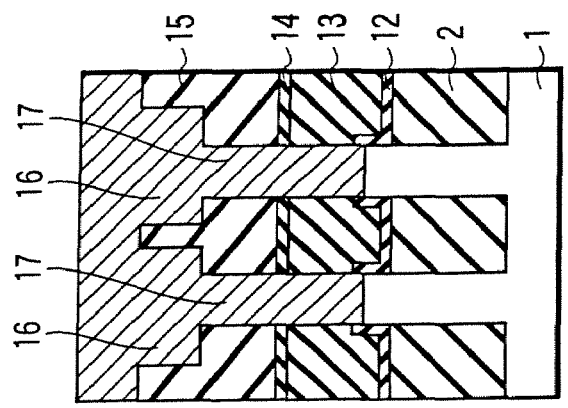
Figure 14A:
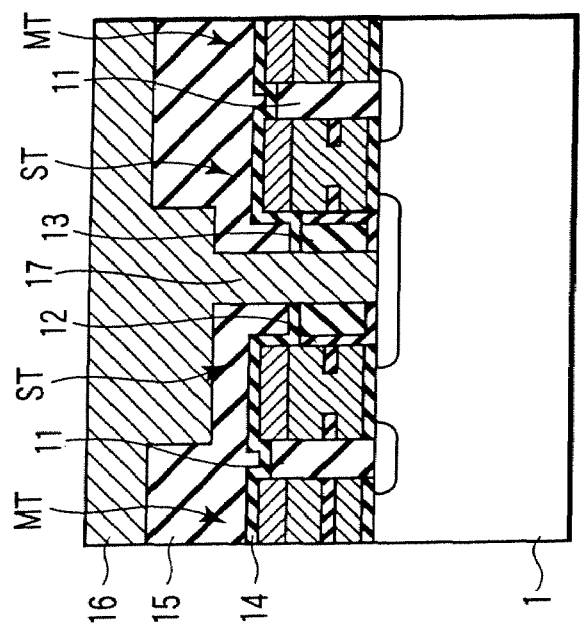

Next, as shown in FIGS. 14A, 14B and 14C, a conductive layer is deposited over the entire surface of the structure thus far obtained to the interconnect layers 16 and the contact plugs 17. As a result, the contact holes 22 and the interconnect trenches 23 are filled.

Next, as shown in FIGS. 2A, 2B and 2C, the conductive layer on the PMD film 13 is removed, thereby forming the interconnect layers 16 and the contact plugs 17. After that, a further interlayer insulating layer is formed as desired and interconnect layers and contact plugs are then formed in that interlayer insulating layer.

When the gate structure LT is used as the gate electrode of a transistor, it is also possible to convert its top surface to silicide. FIG. 15 is a schematic sectional view of the main portion of a semiconductor device according to a modification of the first embodiment. The memory cell area remains unchanged from that shown in FIGS. 2A and 2B. As shown in FIG. 15, the gate structure LT is formed on top with a silicide layer 8 as in the memory cell area. The top of the interlayer insulating layer 11 and the barrier layer 12 on the sidewall of the gate structure LT is located lower than the top of the gate structure LT.

The top of the PMD film 13 above the semiconductor substrate 1 is located at the same level as the top of the PMD film 13 between the gate structures ST (see FIG. 2A). The barrier layer 14 covers the top of the PMD film 13 and the gate structure LT.

Next, a method of manufacturing the semiconductor device of FIG. 15 will be described with reference to FIGS. 16, 17, and 18, which are sectional views in the order of steps of manufacture of the semiconductor device. FIG. 16 corresponds to the peripheral circuit area shown in FIG. 8C. Likewise, FIGS. 17 and 18 correspond to the peripheral circuit areas shown in FIGS. 9C and 10C, respectively.

First, the process up to the planarization of the PMD film 13 shown in FIGS. 7A, 7B and 7C is carried out. Next, the barrier layer 12 on the gate structures MT, ST and LT is removed as shown in FIGS. 8A, 8B and 16. A masking layer (not shown) used in this step has an opening over the gate structure LT the top of which is to be subjected to silicidation. In this step, the top of the PMD film 13 around the gate structure LT also sinks.

Figure 17:
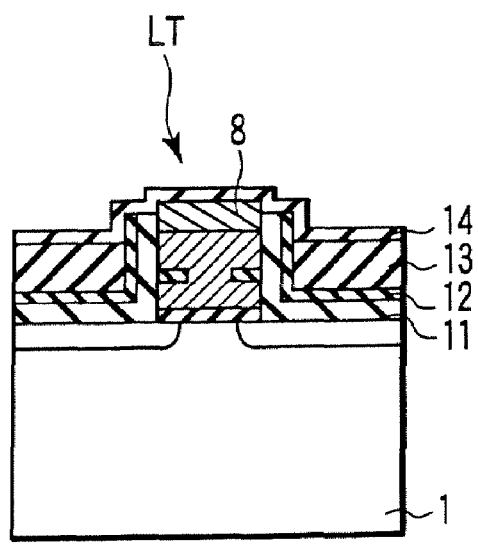

Next, as shown in FIGS. 9A, 9B and 17, a silicide layer 8 is formed on the top of each of the gate structures MT, ST and LT. A barrier layer 14 is then formed over the entire surface of the structure thus far obtained. As a result, the top of the gate structure LT is covered with the barrier layer 14.

Figure 18:
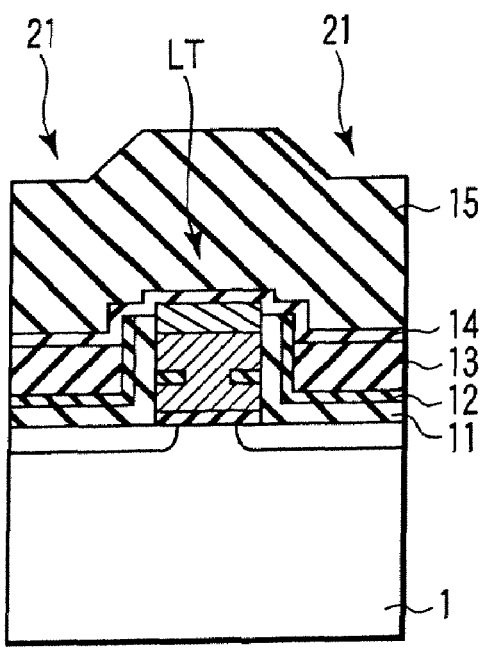

Next, as shown in FIGS. 10A, 10B and 18, a PMD film 15 is deposited over the entire surface of the barrier layer 14. As in the memory cell area, the PMD film 15 has depressions 21 above the PMD film 13 which result from a difference in level between the top of the gate structure LT and the top of the PMD film 13.

After that, the same processes as with FIGS. 11A, 11B to FIGS. 13A and 13B are carried out. Next, as shown in FIGS. 2A, 2B and 15, the conductive layer on the PMD film 13 is removed, thereby forming interconnect layers 16 and contact plugs 17.

According to the semiconductor device of the first embodiment of the present invention, the PMD film 15 is formed on the gate structures MT, ST and LT and then planarized. For this reason, the depressions 21 which are inevitably formed in the surface of the PMD film 15 upon deposition can be eliminated. Otherwise, the interconnect layers 16 formed in the surface of the PMD film 15 would be electrically connected to one another through the conductive material buried in the depressions 21.

Second Embodiment

The second embodiment, which differs from the first embodiment in the shape of the contact plug 17, will be described with reference to FIGS. 19A and 19B through FIGS. 25A and 25B. FIGS. 19A and 19B are sectional views of the main portion of a semiconductor device according to the second embodiment of the present invention. The planar structure remains unchanged from the structure of the first embodiment shown in FIG. 1A. FIGS. 19A and 19B correspond to the sectional views taken along lines IIA-IIA and IIB-IIB of FIGS. 1A and 1B, respectively. The structure of the peripheral circuit area and each step of manufacture remain unchanged from those in the first embodiment including its modification, and hence descriptions thereof are omitted.

As shown in FIGS. 19A and 19B, the contact plug 17 is composed of a first portion 17a and a second portion 17b. The first portion 17b forms the lower portion of the contact plug 17 and is in contact with the semiconductor substrate 1. The second portion 17b forms the upper portion of the contact plug 17 and is connected to the interconnect layer 16. The second portion 17a is larger in planar size than the first portion 17b. The boundary between the first and second portions 17a and 17b is at the same level as the top of the barrier layer 14.

Next, a method of manufacturing the semiconductor device shown in FIGS. 19A and 19B will be described with reference to FIGS. 20A and 20B through FIGS. 25A and 25B. FIGS. 20A through 25A are sectional views in the order of steps of manufacture of the sectional structure of FIG. 19A. FIGS. 20B through 25B are sectional views in the order of steps of manufacture of the sectional structure of FIG. 19B.

First, the process up to the deposition of the barrier layer 14 shown in FIGS. 9A and 9B is carried out. Next, using lithographic and etching techniques a masking layer (not shown) having an opening for forming the first portion 17a of the contact plug 17 between the gate structures ST is formed over the entire surface of the structure thus far obtained. This opening has a linear shape along a direction perpendicular to the paper of FIG. 9A or in the vertical direction of FIG. 1A.

Next, as shown in FIGS. 20A and 20B, the barrier layer 14 is removed by means of etching techniques, such as RIE, using the masking layer as a mask. It is difficult to set high the selectivity between the barrier layer 14 and the PMD film 13 from the relationship between materials suitable for the functions of these layers. For this reason, the top of the PMD film 13 is partially etched in this step, thereby forming a groove 31 in the upper portion of the PMD 13.

Figure 21A:
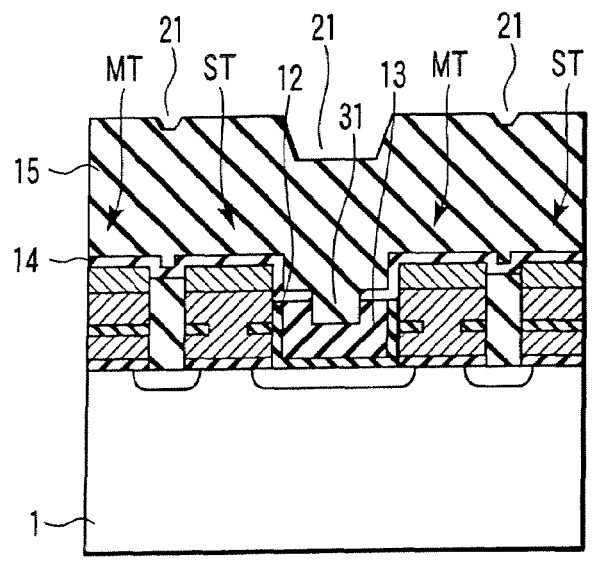
Figure 21B:
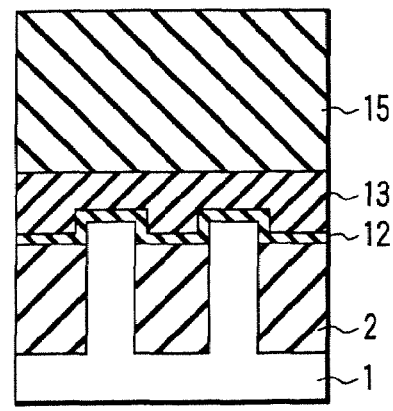

Next, as shown in FIGS. 21A and 21B, a PMD film 15 is deposited onto the barrier layer 14 by means of the same process as shown in FIGS. 10A, 10B and 10C. At this point, the groove 31 is also filled with the PMD film 15. In this embodiment, a portion of the top of the PMD film 13 between the gate structures ST is lower than in the first embodiment and hence the depressions 21 formed in the surface of the PMD film 15 are larger than those in the first embodiment.

Figure 22A:
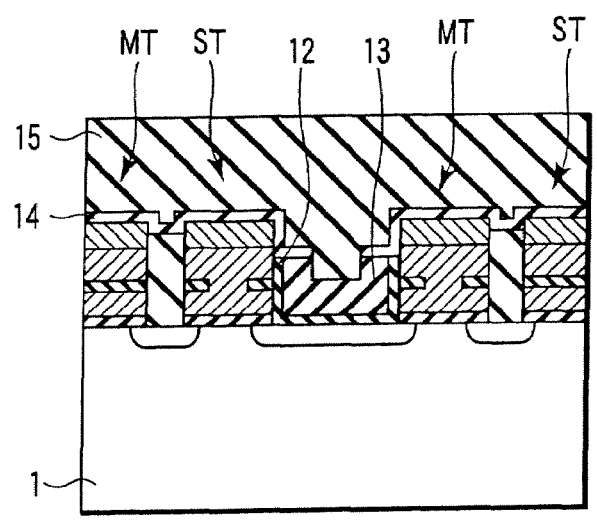
Figure 22B:
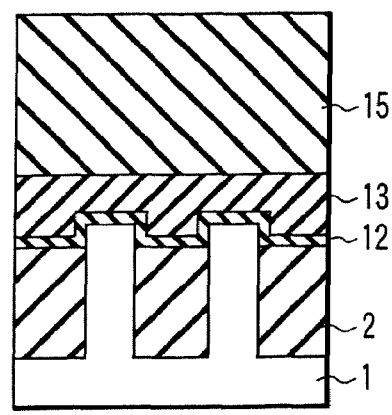

Next, as shown in FIGS. 22A and 22B, the top of the PMD film 15 is planarized by means of the same process as in FIGS. 11A, 11B and 11C.

Figure 23A:
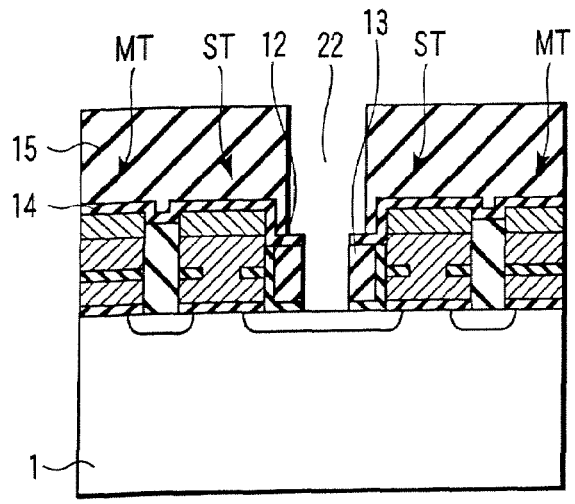
Figure 23B:
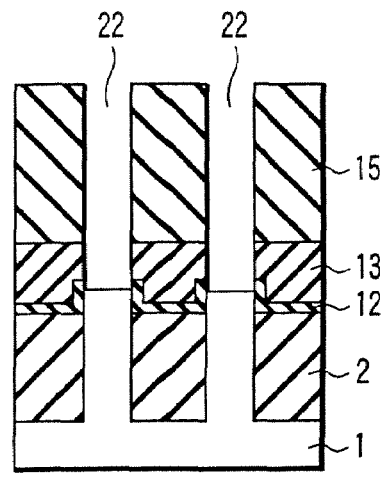

Next, as shown in FIGS. 23A and 23B, contact holes 23 are formed in the PMD films 13 and 15 by means of the same process as in FIGS. 12A, 12B, and 12C. Each of the contact holes 22 is formed by means of etching techniques using a masking layer (not shown) having openings each covering the groove 31. By etching, the groove 31 is dug down to the semiconductor substrate 1 with the result that the contact hole reaches the semiconductor substrate.

Figure 24A:
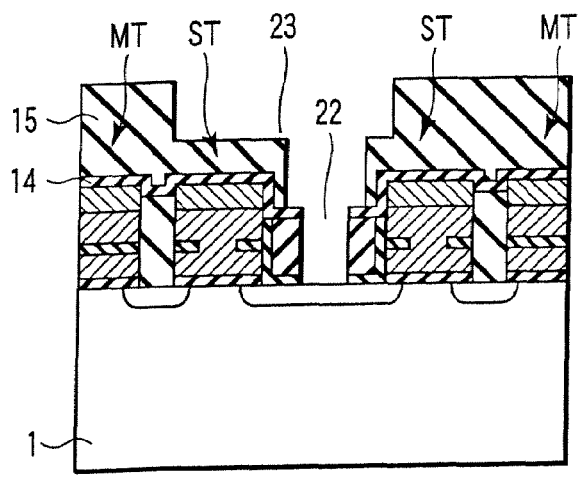
Figure 24B:
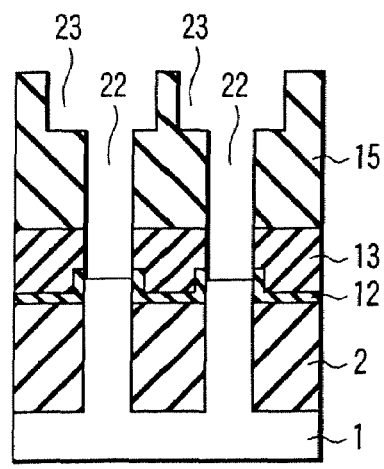

Next, as shown in FIGS. 24A and 24B, interconnect trenches 23 are formed by the same process as in FIGS. 13A, 13B and 13C.

Figure 25A:
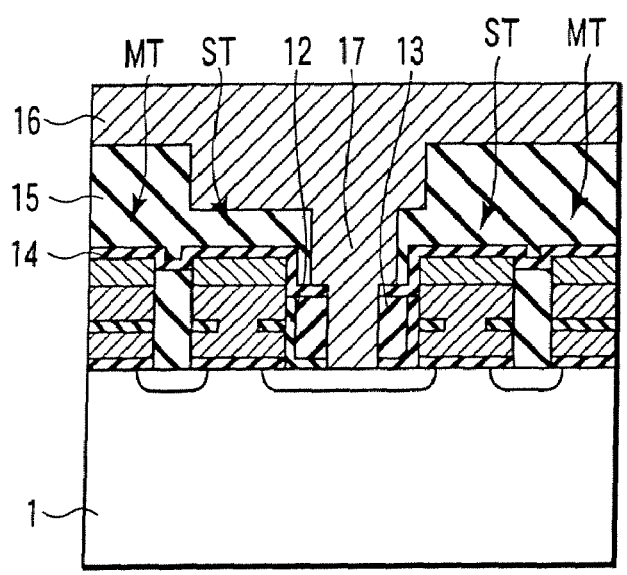
Figure 25B:
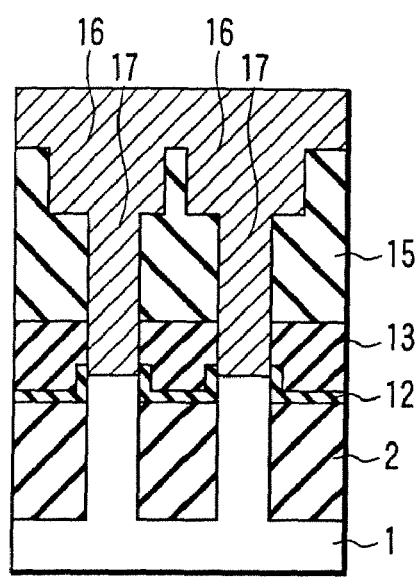

Next, as shown in FIGS. 25A and 25B, using the same process as in FIGS. 14A, 14B and 14C a conductive layer is deposited over the entire surface of the structure thus far obtained, thereby forming interconnect layers 16 and contact plugs 17.

Next, as shown in FIGS. 19A and 19B, the conductive layer on the PMD film 15 is removed. After that, a further interlayer insulating layer is formed as desired. Interconnect layers and contact plugs are then formed in the interlayer insulating layer as well.

In the second embodiment, as in the first embodiment, the surface of the PMD film 15 is planarized after it is deposited onto the gate structures MT, ST and LT. Thus, the second embodiment offers the same advantages as the first embodiment.

In addition, in the second embodiment, the contact hole for the contact plug 17 is formed by means of two-step etching process. For this reason, problems of contact hole formation failures, connection of contact holes, etc. can be avoided which can occur as the dimensions of devices are scaled down. When the contact hole is formed by two etching steps, the depression 21 formed in the surface of the PMD film 15 upon deposition are larger than in the first embodiment. Thus, the provision of a step of eliminating the depression 21 as in the second embodiment is particularly useful when a contact hole is formed by two etching steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming two first gate electrodes along a first direction on a first surface of a semiconductor substrate and source/drain areas sandwiching a channel region under each of the first gate electrodes;
    forming a first interlayer insulating layer to fill a region between the first gate electrodes;
    lowering a top of the first interlayer insulating layer;
    depositing a second interlayer insulating layer on the first interlayer insulating layer and the first gate electrodes;
    planarizing a surface of the second interlayer insulating layer; and
    forming an interconnect layer in the second interlayer insulating layer and a contact plug in the first interlayer insulating layer and the second interlayer insulating layer so that the contact plug is in contact with the interconnect layer and one of the source/drain areas.

2. The method according to claim 1, further comprising:
    covering an exposed portion of a top of one of the first gate electrodes with a first insulating layer before forming the first interlayer insulating layer; and
    exposing the top of one of the first gate electrodes after forming the first interlayer insulating layer, exposing the top of one of the first gate electrodes involving lowering a top of the first interlayer insulating layer.

3. The method according to claim 2, further comprising forming a metal compound on the top of one of the first gate electrodes before the second interlayer insulating layer is deposited after exposing the top of one of the first gate electrodes.

4. The method according to claim 2, further comprising forming a second gate electrode on the first surface before forming the first interlayer insulating layer, and wherein covering the exposed portion of the top of one of the first gate electrodes with the first insulating layer involves covering the second gate electrode with the first insulating layer.

5. The method according to claim 1, wherein forming the contact plug includes:
    forming a groove in an upper portion of the first interlayer insulating layer;
    forming a hole, which is larger in size in a plane parallel to the first surface than the groove, in the second interlayer insulating layer to communicate with the groove and digging the groove down to the first surface to form a contact hole; and
    filling the contact hole with a conductive material.

6. The method according to claim 5, further comprising:
    covering an exposed portion of a top of one of the first gate electrodes with a first insulating layer before forming the first interlayer insulating layer; and
    exposing the top of one of the first gate electrodes after forming the first interlayer insulating layer, exposing the top of one of the first gate electrodes involving lowering a top of the first interlayer insulating layer.

7. The method according to claim 6, further comprising forming a metal compound on the top of one of the first gate electrodes before the second interlayer insulating layer is deposited after exposing the top of one of the first gate electrodes.

8. The method according to claim 6, further comprising forming a second gate electrode on the first surface before forming the first interlayer insulating layer, and wherein covering the exposed portion of the top of one of the first gate electrodes with the first insulating layer involves covering the second gate electrode with the first insulating layer.

* * * * *